(12) United States Patent
Weston et al.

(10) Patent No.: US 8,476,808 B2
(45) Date of Patent: Jul. 2, 2013

(54) 1-D TIRE APPARATUS

(75) Inventors: David A. Weston, Hendersonville, NC (US); Damon L. Christenbury, Fountain Inn, SC (US)

(73) Assignee: Michelin Recherche et Technique, Granges-Paccot (CH)

( * ) Notice: Subject to any disclaimer, the term of this patent is extended or adjusted under 35 U.S.C. 154(b) by 110 days.

(21) Appl. No.: 13/059,097

(22) PCT Filed: Aug. 29, 2008

(86) PCT No.: PCT/US2008/074765
§ 371 (c)(1),
(2), (4) Date: Feb. 15, 2011

(87) PCT Pub. No.: WO2010/024819
PCT Pub. Date: Mar. 4, 2010

(65) Prior Publication Data
US 2011/0140581 A1    Jun. 16, 2011

(51) Int. Cl.
*H01L 41/08* (2006.01)
(52) U.S. Cl.
USPC .......................................... 310/339; 310/329
(58) Field of Classification Search
USPC .......................................... 310/328, 330–332
See application file for complete search history.

(56) References Cited

U.S. PATENT DOCUMENTS

| | | | |
|---|---|---|---|
| 4,203,481 A | 5/1980 | Ranik, Jr. | |
| 5,747,916 A | 5/1998 | Sugimoto et al. | |
| 6,093,997 A | 7/2000 | Zimnicki et al. | |
| 6,359,532 B1 | 3/2002 | Sugiyama et al. | |
| 6,951,143 B1 | 10/2005 | Adderton et al. | |
| 7,278,455 B2 | 10/2007 | Hedo et al. | |
| 7,703,493 B2 | 4/2010 | Willard, Jr. | |
| 2003/0056351 A1 | 3/2003 | Wilkie et al. | |
| 2003/0209063 A1 | 11/2003 | Adamson et al. | |
| 2004/0211250 A1 | 10/2004 | Adamson et al. | |
| 2005/0110277 A1 | 5/2005 | Adamson et al. | |
| 2007/0012391 A1 | 1/2007 | Willard, Jr. | |
| 2007/0175554 A1 | 8/2007 | Bertrand | |
| 2009/0102633 A1 | 4/2009 | Ebinuma et al. | |
| 2010/0043541 A1 | 2/2010 | Kobayakawa | |

FOREIGN PATENT DOCUMENTS

| | | |
|---|---|---|
| JP | 2000-097794 | 4/2000 |
| JP | 2007-163230 | 6/2007 |
| WO | 9941093 | 8/1999 |
| WO | 0047430 | 8/2000 |

(Continued)

OTHER PUBLICATIONS

PCT International Search Report for PCT/US2009/074765, dated Nov. 7, 2008.

*Primary Examiner* — Mark Budd
(74) *Attorney, Agent, or Firm* — Dority & Manning, P.A.

(57) ABSTRACT

Disclosed is a tire mountable apparatus and methodology for mounting devices within a tire. In certain embodiments a signal generator may be mounted to the tire to generate signals based on changes in the radius of curvature of a tire. A piezoelectric sandwich and/or a substrate is/are provided having a length and width based at least in part on tire dimensions and positioned in the tire such that the longer length dimension is positioned laterally with respect to the width of the tire. The sandwich and/or substrate is/are sized such that the width dimension provides substantially no response to changes in the circumferential radius of curvature of the tire so that the length dimension defines the primary bending direction while the width dimension provides a strain free mount for associated devices.

18 Claims, 3 Drawing Sheets

FOREIGN PATENT DOCUMENTS

| | | |
|---|---|---|
| WO | WO 01/80327 A1 | 10/2001 |
| WO | WO 03/095245 A1 | 11/2003 |
| WO | WO 2006/054983 A1 | 5/2006 |
| WO | WO 2006/071228 A1 | 7/2006 |
| WO | WO 2006/071229 A1 | 7/2006 |
| WO | WO 2006/071230 A1 | 7/2006 |
| WO | WO 2006/135366 A1 | 12/2006 |

# 1-D TIRE APPARATUS

FIELD OF THE INVENTION

The present subject matter relates to tire apparatus. In particular, the present subject matter relates to apparatus having length and width dimensions related to physical aspects associated with tires in which it may be mounted for providing enhanced endurance of the tire apparatus. The present subject matter also relates to the use of such tire apparatus or structures to obtain enhanced operational and endurance characteristics for devices supported by such structures.

BACKGROUND OF THE INVENTION

The incorporation of electronic devices with tire structures has been shown to yield many practical advantages. Tire electronics may provide their own power source whose operation depends on tire related phenomena and may also include sensors and other components for obtaining information regarding various physical parameters of a tire, such as temperature, pressure, number of tire revolutions, tire rotation speed, etc. Such information may be useful in tire monitoring and warning systems, and may even be employed with feedback systems to monitor proper tire pressure levels.

United States Published Patent Application 2003/0209063 (Adamson et al.) is directed to a system and method for generating electric power from a rotating tire's mechanical energy using piezoelectric fiber composites.

United States Published Patent Application 2003/0056351 (Wilkie et al.) is directed to a piezoelectric micro-fiber composite actuator and a method for making the same.

U.S. Pat. No. 6,093,997 (Zimnicki et al.) is directed to a piezoelectric resonator embedded within an electrically insulating substrate assembly, such as a multilayer printed circuit board.

U.S. Pat. No. 5,747,916 (Sugimoto et al.) is directed to a piezoelectric transformer unit which transforms an input voltage into an output voltage and which includes a piezoelectric transformer element driven by high electric power.

The disclosures of all of the foregoing United States patent and published patent applications are hereby fully incorporated into this application for all purposes by reference thereto. While various implementations of piezoelectric generators have been developed, and while various combinations of tire characteristic monitoring devices have been implemented, no design has emerged that generally encompasses all of the desired characteristics as hereafter presented in accordance with the subject technology.

SUMMARY OF THE INVENTION

In view of the recognized features encountered in the prior art and addressed by the present subject matter, an improved tire mountable apparatus and methodology for providing enhanced endurance for tire patches and associated supported devices and structures from faults based on monotonic changes in the transverse radius of curvature of a tire has been provided.

In one particular embodiment a tire mountable apparatus comprises a substrate having a first surface and a second surface and a pair of terminal/support elements extending from said first surface. The first surface has length L and width W, where L>2W, and W<the length of arc subtended along the inner surface of a tire corresponding to 5° of rotation measured from a line extending from the center of rotation to the inner surface of an unloaded tire inflated at rated pressure.

The pair of terminals extends from the first surface in a line perpendicular to a line in the direction of the length L, and the line perpendicular to the direction of length L identifies the direction of rotation of a supporting tire.

In a particular embodiment, an elastomeric patch having a first surface and a second surface separated by a mesa is provided and the said second surface of the substrate is adhered to the first surface of the elastomeric patch. In a more specific embodiment the mesa has a height H, where $0<H\leq 5$ mm, and L>W>H.

In another embodiment, a layer of piezoelectric material having a top surface and a bottom surface is provided with a first conductive layer covering the top surface and a second conductive layer covering the bottom surface. The piezoelectric layer, the first and second conductive layers, and the substrate form a sandwich structure, and the sandwich structure is secured to the first surface of the elastomeric substrate. In particular more particular embodiments the substrate is FR4 and the piezoelectric material is lead zirconium titanate (PZT).

In yet a further embodiment, the present subject matter may correspond to a method for reducing strain in a tire mounted assembly comprising providing a substrate having a first surface and a second surface, where the substrate has length L and width W. More particularly, L is greater than 2W, and W is less than the length of arc subtended along the inner surface of a tire corresponding to 5° of rotation measured from a line extending from the center of rotation to the inner surface of an unloaded tire inflated at rated pressure. A pair of terminal/support elements are extended from the first surface and positioned in a line perpendicular to a line in the direction of the length L. The substrate is mounted in a tire so that the line perpendicular to the direction of the length L is aligned substantially in the direction of rotation of the tire so that strain on the tire mounted assembly is effectively limited to one direction.

In yet still a further embodiment, a method is provided that corresponds to securing the substrate laterally in the central portion of the tire summit In still further embodiments a piezoelectric device having a piezoelectric layer sandwiched between first and second conductive layers with one of said first and second conductive layers supported by said substrate layer may be provided. In alternative embodiments a printed circuit board may be mounted to the pair of terminal/support elements whereby strain between the pair of terminal/support elements and the printed circuit board is minimized.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
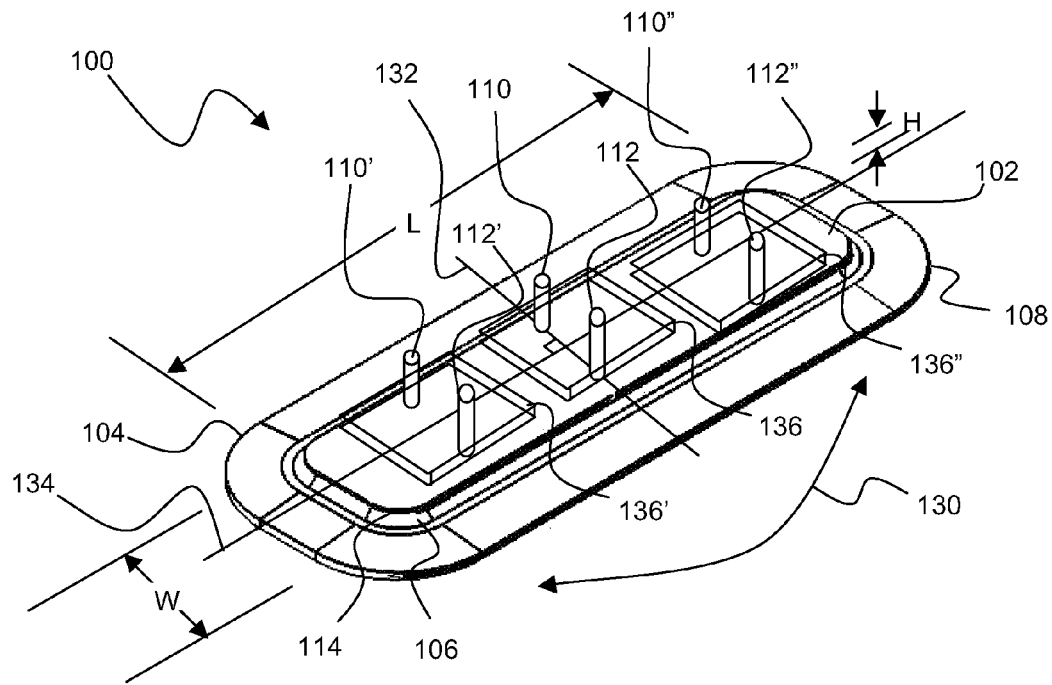
FIG. 1 diagrammatically illustrates a 1-D tire mountable apparatus constructed in accordance with present technology.

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with a 1-D tire mountable apparatus having a length and width related to certain aspects of the tires in which the apparatus may be mounted. It should be appreciated in the following discussion that the term "1-D" is primarily intended to represent that the tire mountable apparatus of the present technology is so designated, not because it actually has only one dimension, but rather to emphasize the fact that the width dimension is significantly less than the length dimension for reasons that will be more fully explained later. Of course also, the apparatus does have a height as the device is actually a three-dimension object, but such height also, relative to the length is significantly less.

Further, it should be appreciated that, as employed later herein with respect to certain embodiments of the present technology, the term "generator" is meant to convey that flexure of a piezoelectric device as may be associated with the present subject matter will produce an output voltage across output terminals provided on the device. Further still, as the piezoelectric device associated with the present technology may be employed as a sensor as well as a generator either separately or concurrently, the terms generator and sensor may be used hereinafter interchangeably.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject 1-D tire mountable apparatus and methodology. Referring now to the drawings, FIG. 1 diagrammatically illustrates 1-D tire mountable apparatus 100 constructed in accordance with present technology. As may be seen from FIG. 1, 1-D tire mountable apparatus 100, of course, actually has three dimensions. In particular, a substrate portion of apparatus 100 which may be configured as a sandwich structure 102 is constructed as indicated in FIG. 1 as having a length L and width W. Further, the width dimension W is significantly less than the length L In preferred embodiments, L is at least twice W.

Also illustrated as an optional portion of tire mountable apparatus 100 is an elastomeric patch 108 that has a top surface 114 and a lower surface 104 separated by a mesa 106 having a height H. In accordance with present technology the height H is less than either the width W or length L.

Figure 4:
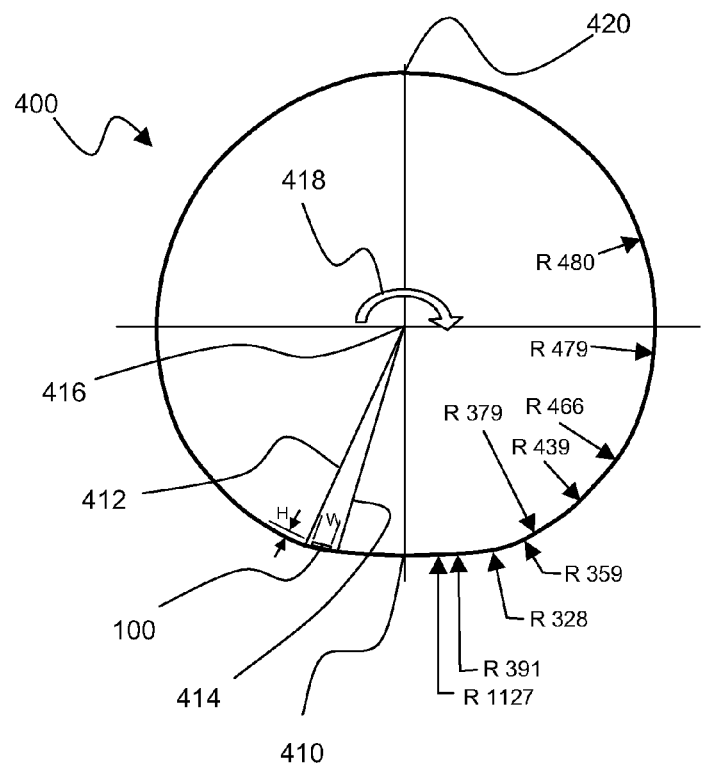
FIG. 4 representatively illustrates variations in the radius of curvature of an exemplary tire in which the present technology may be employed.

With brief reference to FIG. 4, those of ordinary skill in the art will appreciate that a tire operating under rated pressure and rated load will have a profile similar to that illustrated in FIG. 4. This profile includes a generally flat area normally described as the contact patch with curved portions on either side of the contact patch. Further, there are transition areas immediately preceding and following the contact patch where the radius of curvature of a tire operating under rated pressure and rated load changes from a substantially constant radius to a generally flat or infinite radius. As will be explained further hereinafter, the width W of tire mountable apparatus 100 is selected to fall within these transition areas. More particularly, the width W is selected to fall within a somewhat narrower width as will be more fully explained later with respect to FIG. 6.

As will be explained further later, the device of the present technology is referred to herein as a "1-D" device base generally on the concept that the present technology has provided a device that, when including a piezoelectric device, is generally limited to generation of an output signal as a result of strain applied principally from only one dimension, i.e., the relatively longer length dimension of the device. Conversely, the width W being significantly less that the length L substantially eliminates any bending and, consequently, signal production based on minimal or no bending in the W dimension. Further, when employed as a support structure for printed circuit board mounted electronics, the 1-D tire mountable apparatus provides a substantially strain free mounting arrangement for such printed circuit boards. These concepts will be more fully explained with reference to FIGS. 3 and 4 herein after.

With further reference to FIG. 1, it will be seen that 1-D tire mountable apparatus 100 corresponds, in one embodiment, to an optional elastomeric patch having a substrate that may correspond to a sandwich structure 102. Sandwich structure 102, in an exemplary embodiment may correspond to a layer of piezoelectric material, conductive layers and at least one support layer as will be explained more fully with respect to FIG. 2 that may function as a sensor or voltage generators.

A substrate in accordance with present technology, possibly in the form of sandwich structure 102, may be supported on an optional layer of elastomeric material 108 to form a patch that may be secured to the inner liner of a tire using standard tire patch repair methodologies. Elastomeric material 108 may be formed as a base portion 104 and a centrally located raised mesa portion 106 having a top surface 114 on which sandwich structure 102 may be secured. In general, the elastomeric material may correspond to a material composition normally employed as a sidewall material in the construction of pneumatic tires. As those of ordinary skill in the art will appreciate, such material are generally oxidation resistant compounds.

In an exemplary embodiment of the present subject matter, a tire patch assembly may be produced by coating an adhesive on a portion of sandwich structure 102, placing the structure in a specially designed mold configured to accommodate sandwich structure 102, filling the remainder of the mold with an elastomeric material and curing the patch. A patch so formed may then be secured to the inner liner of a tire using standard tire patch repair methods. In an exemplary configuration, the adhesive may be Chemlok® available from LORD Corporation and the elastomeric material may correspond to rubber.

In accordance with another exemplary embodiment of the present subject matter, it is possible to secure sandwich structure 102 directly to the inner liner of a tire using Chemlok® alone without the intermediary use of the elastomeric material. It should also be appreciated that a tire mountable apparatus constructed in accordance with present technology may be similarly mounted to a non-pneumatic tire and wheel combination known as a Tweel®, manufactured by the owner of the present technology.

Figure 2:
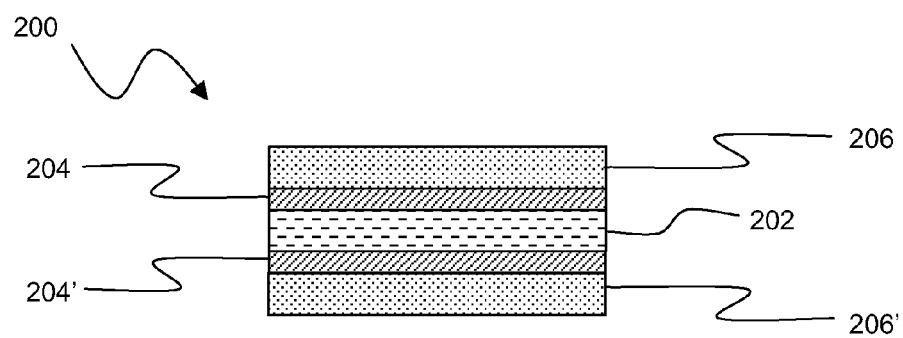
FIG. 2 diagrammatically illustrates the sandwich construction of a piezoelectric generator as may be associated with a 1-D tire mountable apparatus constructed in accordance with present technology.

With brief reference now to FIG. 2, there is illustrated an exemplary sandwich structure 200, corresponding to sandwich structure 102 of FIG. 1. Sandwich structure 200 corresponds to a layer of piezoelectric material 202 with a first layer of conductive material 204 on one side thereof and a second layer of conductive material 204' on a second side there of The first layer of conductive material 204 is secured to a layer of insulating material 206 that acts as a supporting substrate for the sandwich structure 200. In exemplary embodiments of the present subject matter, piezoelectric material 202 may correspond to lead zirconium titanate (PZT), conductive materials 204, 204' may comprise copper layers, and insulating material 206 may correspond to a fire resistant substrate material commonly called FR4.

In another exemplary embodiment of the present subject matter, an optional second layer of insulating material 206' may be secured to conductive layer 204'. Such a second layer of insulating material, if provided, may also correspond to FR4.

With further reference to FIG. 1, a pair of connection/support terminals 110, 112 is positioned along line 132 and on either side of central line 134. Terminal 110 may be electrically coupled to conductive layer 204 while terminal 112 may be electrically coupled to conductive layer 204'. It should be appreciated by those of ordinary skill in the art that the connection/support terminal configurations described are exemplary only as other configurations are possible and are also contemplated by the present technology. For example, while the present disclosure generally illustrates a sandwich structure 102 substantially completely covering and even, optionally, partially overhanging the top surface 114 of patch 108, such are not specific limitations of the present technology as sandwich structure 102 may actually be sub-divided into two or more portions. Further, while a pair of connection/support terminals 110, 112 are illustrated, there may be provided additional such connection/support terminals positioned along a common line with connection/support terminals 110, 112 or along parallel lines as illustrated at 110', 112' and 110", 112". Further still, in embodiments where sandwich structure 102 may be sub-divided into two or more portions, such portions may be electrically connected in parallel by way of connection/support terminals 110, 112 or in other electrical configurations as desired including serially or individually by providing additional connection/support terminals.

A significant aspect of the present disclosure is that the terminal/support pair 110, 112 is positioned along line 132, or, more generally, along a line perpendicular to line 134, where line 134 is along the primary bending direction 130 of the 1-D tire mountable apparatus 100. In accordance with present technology, lines 132 and 134 may vary from true perpendicular (i.e.)90° alignment by ±10, ±5, or ±2 degrees, with some loss in benefit. As will be made clear later, line 132 may be said to identify the direction of rotation of a tire in which a tire mountable apparatus constructed in accordance with the present technology is to be mounted. In general, because the primary bending direction 130 is along central line 134, line 132 and hence the mounting position for terminal/support pair 110, 112 may be positioned anywhere along line 134, however the preferred position is generally at a more central location as illustrated.

As will be explained further later, when 1-D tire mountable apparatus 100 is positioned in a tire in accordance with present technology, a primary bending direction as illustrated by double-arrowed line 130 is established due to the positioning of the 1-D tire mountable apparatus 100 in the tire as well as the length L and width W of the 1-D tire mountable apparatus 100.

With bending limited to along this one dimension, i.e. the 1-D direction, strain at and between connections to devices mounted to connection/support terminals 110, 112 and alternately or in addition connection/support terminals 110', 112' and 110", 112", is minimized due to their perpendicular alignment to the primary strain direction, i.e. the 1-D orthogonal connection line 132. If, for example, on the other hand, connection/support terminals 110, 112 were to be positioned along line 134, the primary bending line, separation distances between connection/support terminals 110, 112 would change with any bending along line 134. Such would place a significant strain on any device or printed circuit board 136 (illustrated in phantom in FIG. 1) and alternately or in addition circuit boards 136', 136" as may be mounted to connection/support terminals 110, 112 and/or connection/support terminals 110', 112' and/or 110", 112". It should be appreciated that any printed circuit board 136, 136', 136" mounted to their corresponding connection/support terminals are mounted in such a manner that the connection/support terminals provide all of the support for the printed circuit board. That is, the printed circuit boards are mounted such that they are not supported by contact with any underlying structure other than the connection/support terminals.

It should further be appreciated by those of ordinary skill in the art that in the instance that multiple circuit boards 136, 136', 136" are employed, such circuit boards should not be physically coupled together as such would defeat the purpose of the perpendicular to the primary strain direction orientation of the support terminals. Nor should any additional terminal/support pins be provided in parallel line alignment with the alignment line of the pair of support terminals 110, 112, and coupled to the same printed circuit board, although additional support terminals may be placed along the same line with support terminals 110, 112.

Figure 5:
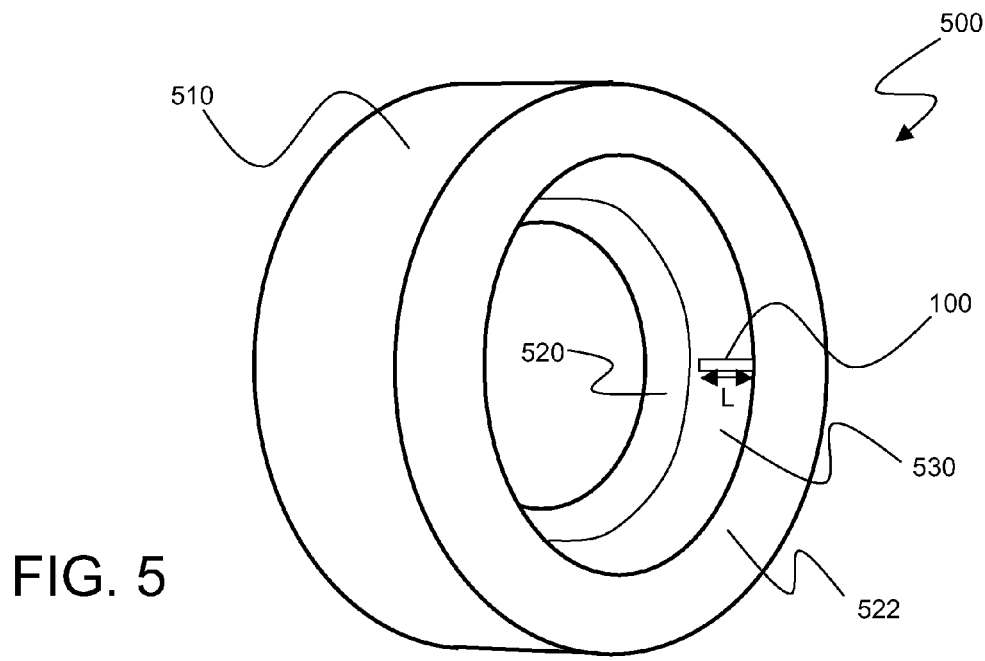
FIG. 5 generally represents an exemplary tire and illustrates the mounting position and orientation of the 1-D tire mountable apparatus therein.

With brief reference to FIG. 5, there is generally illustrated a tire 500 having a tread portion 510 and sidewall portions 520, 522. In accordance with present technology, 1-D tire mountable apparatus 100 is mounted laterally between sidewall portions 520, 522 in the central portion of tire summit 530. As may be seen in FIG. 5, 1-D tire mountable apparatus 100 is mounted on the inner liner of tire 500 oriented such that the length dimension L extends in the direction of sidewalls 520, 522, i.e., is aligned substantially laterally to the direction of rotation of tire 500. It should be appreciated that in the present context, phrases like "aligned substantially" in a particular direction is intended to signify that there may be as much as ±20° or ±10° variation in alignment from a perfect alignment in the directions indicated and still fall with the scope of the present subject matter although there will be some reduction in durability at higher deviations. In exemplary configurations, the length dimension may be chosen such that tire mountable apparatus 100 lies in the central portion of the tire summit and extends over a significant portion of that area of a belted tire construction where the space separating the various belts is constant. Of course, as previously mentioned, tire mountable apparatus 100 may also be similarly mounted in a non-pneumatic wheel and tire Tweel®.

Based on the lateral orientation and the fact that the width dimension is relatively insignificant at least with respect to any bending or generation of strain from variations based on the rolling direction of the tire, 1-D tire mountable apparatus 100 sees primarily a monotonic radius change based on the tire's transverse profile changes with rotation.

Figure 3:
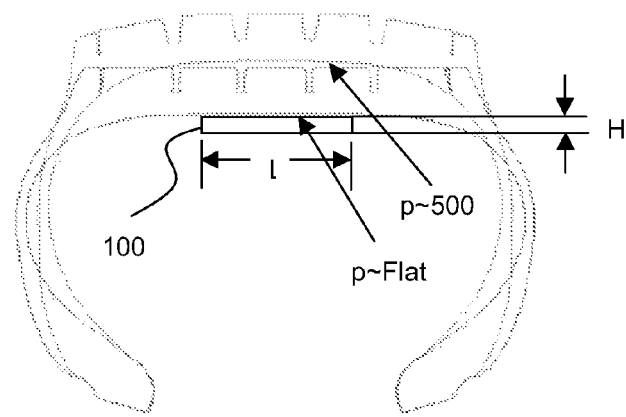
FIG. 3 representatively illustrates, in overlay, representations for comparison of transverse profiles at top of rotation and center of contact patch of a representative tire in which the present technology may be employed.

This later profile change concept may best be understood from a study of FIGS. 3 and 4. FIG. 3 representatively illustrates, in overlay, representations for comparison of transverse profiles at top of rotation and center of contact patch of a representative tire in which the present technology may be employed and illustrates in phantom the mounting orientation of tire mountable apparatus 100. FIG. 4 representatively illustrates variations in the radius of curvature of an exemplary tire in which the present technology may be employed. As generally represented in FIG. 3, for an exemplary normally inflated 275/80R22.5 tire, the transverse radius of curvature or profile (p) changes from p~500 mm with the tire at the top of its rotation to p~flat, i.e., a substantially infinite radius of curvature, at the center of the contact patch. Those of ordinary skill in the art will appreciate that the "contact patch" corresponds to the surface area of the tire in "contact" with the travel surface and that such surface is substantially "flat" over a generally smooth surface.

FIG. 4, on the other hand, illustrates that the circumferential radius of curvature (R) will vary between a substantially constant non-contact patch area, i.e., a substantially un-deflected portion of the tire, and a significantly higher radius of curvature within the contact patch during tire rotation and will produce two curvature peaks at entry and exit of the contact patch that increase with deflection. In accordance with present technology, 1-D tire mountable apparatus 100, due to the selection of width and the lengthwise mounting orientation in a tire, sees primarily a monotonic radius change from, for example, about 500 mm to flat, thereby avoiding two deflection-dependent circumferential peaks.

Exposure to primarily a monotonic radius change is one of the features of the present technology that results in enhanced endurance of the subject 1-D tire mountable apparatus. A second feature resulting from 1-D width selection, when a piezoelectric generator/sensor is associated with the tire mountable apparatus, is the substantial elimination of extraneous signal generation from longitudinal strain resulting from passage of the piezoelectric device associated tire mountable apparatus through the entry and exit points to the tire contact patch. Such inherent signal filtering contributes to greater accuracy of signal processing for the various uses to which such signals may be placed within any particular usage environment.

Figure 6:
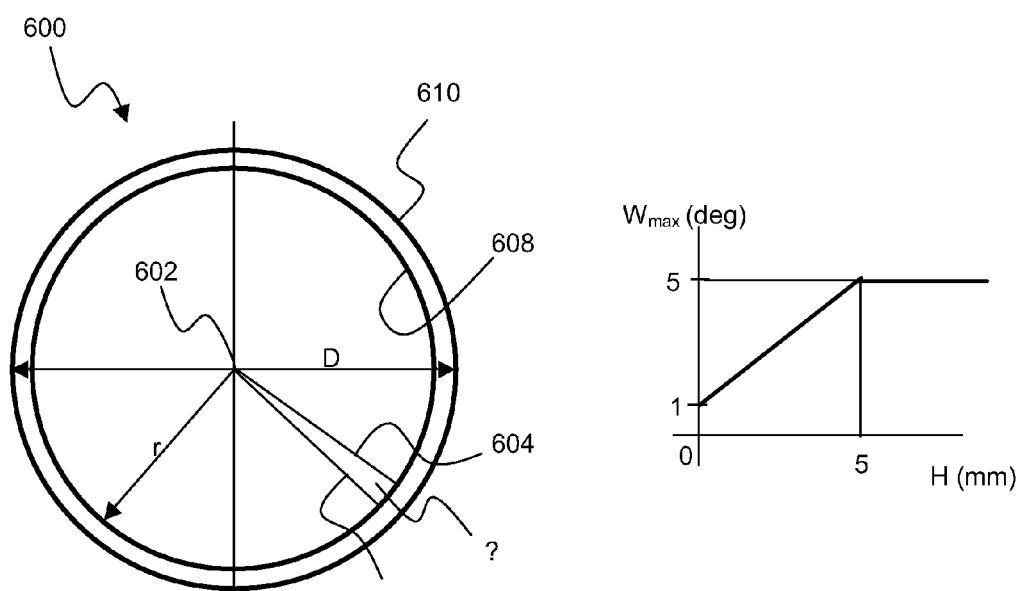
FIG. 6 generally represents a cross-section of an unloaded tire inflated at rated pressure useful in explaining the selection of the width dimension of a substrate in accordance with present technology.

With attention directed now to FIG. 6 it will be seen that the width W of the substrate portion of the tire mountable apparatus of the present subject matter may be selected by taking into consideration physical parameters of a tire at rated inflation pressure and under no load conditions. Such a tire is illustrated as tire 600 and has a uniform diameter D. Tire 600 has a radius r extending from a central rotational point 602 to the inner surface 608 of tire 600. Lines 604 and 606 extending from the central rotational point 602 to inner surface 608 establish an angle θ that, in accordance with technology is selected to be 5°. Stated differently, the length of arc subtended along the inner surface 608 of tire 600 corresponds to 5° of rotation measured from line 604 extending from the center of rotation 602 to the inner surface 608 of the unloaded tire 600 when it is inflated to rated pressure. This length of arc established the width W of the substrate.

By selecting the width W of 1-D tire mountable apparatus 100 to be narrow enough to substantially avoid strain from entry into and exit from the contact patch area, a number of benefits are obtained. As an initial benefit, strain on the 1-D tire mountable apparatus 100 per se is effectively limited to one direction thereby offering potential for prolonged life expectancy. In an exemplary configuration, for example in the previously noted exemplary 275/80R22.5 tire, width W may be selected to be less than about 30 mm. In any event, the width W should be limited to a dimension fitting within a tire inner surface dimension as described with relation to FIG. 6.

As previously referred to herein above, as tire 400, operating at rated pressure and rated load, rotates in the direction of arrow 418, two transition zones are created as the tire tread goes into and out of contact with the surface over which the tire is traveling. In the FIG. 4 example, the contact patch exit portion is identified as a transition portion or zone between lines 412, 414. A similar transition portion is, of course, formed at the entrance to the contact patch portion but has not been separately illustrated herein. As illustrated, the width W of tire mountable apparatus 100 is selected to fit entirely within this transition portion or zone so as to substantially avoid flexing of tire mountable apparatus 100 during passage through the transition portion. This leads to a second benefit, which is that generation of extraneous voltage signals from a mounted piezoelectric device from potential bending in a second direction is minimized.

Finally, by reducing the overall width, a more stable mounting orientation for terminal/support elements 110, 112 arranged in a line perpendicular to the primary strain direction is provided that reduces strain on mechanical and electrical coupling to devices and/or printed circuit boards as may be mounted thereon. In an exemplary configuration, the spacing between terminal posts 110, 112 may be selected to be less than about 18 mm.

With respect to overall length dimension determination, it will be appreciated from the previous discussion that the length L of 1-D tire mountable apparatus 100, that is, the lateral dimension with respect to a tire, should be minimized for endurance and maximized for energy generation. By orienting the mountable apparatus length laterally in the summit center, a structure is provided that very effectively increases device endurance while providing a device that is insensitive to tire deflection. As has been previously noted the length L may be chosen such that tire mountable apparatus 100 lies in the tire summit between the shoulders and may extend over a significant portion of that area of a belted tire construction where the space separating the various belts is constant. In an exemplary configuration, the length L may be chosen to be at least twice the width W. In an exemplary configuration, it has been found experimentally that a 10× order of improvement to the distance to fatigue crack onset may be obtained by selecting such mounting orientation and length and width relationships.

Figure 7:
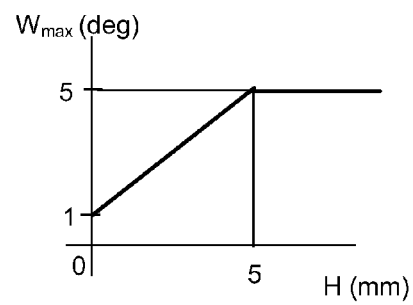
FIG. 7 graphically illustrates the relationship between the mesa height of an elastomeric patch usable with the tire mountable apparatus of the present technology and the width of a substrate selected in accordance with present technology expressed in degrees.

With reference now to FIG. 7, there is illustrated a relationship between the height H of optional elastomeric patch 108's mesa 106. The graph illustrates that the maximum width $W_{max}$ in terms of degrees is related to the height H of the mesa as a linear function up to a maximum mesa height H of 5 mm. In the instance that no elastomeric patch is employed, that is the substrate is adhered directly to the inner liner of the tire, $W_{max}$ is selected to be 1°. As the height H increases, $W_{max}$ increases linearly to a maximum of 5°. Generally this relationship may be defined as $W_{max}=(4/5)H+1$ for $0<H\leq5$. In all circumstances, however, the relationship L>W>H should be respected. Those of ordinary skill in the art will appreciate that the elastomeric patch, if present, provides a degree of isolation between the tire and the mounted apparatus 100. In the case of a piezoelectric sensor/generator being included, an increasing height H will produce a reduction in strain in the length L direction of the device. This, in turn, will produce less voltage generation from the piezoelectric device but will provide an increase in structural reliability so that a design balance should be taken into consideration in selecting the mesa height versus the length L whose selection determines the amount of voltage generated. In any event, the length L should not be so long as to cause the device to extend into the shoulder portion of the tire. The shoulder portion is understood to be that portion of the tire beyond the summit where the spacing of belt layers in a belted tire is no longer substantially constant when moving from the central portion of the summit toward the sidewalls.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A tire mountable apparatus, comprising:
   a substrate having a first surface and a second surface; and
   a pair of terminal/support elements extending in the same direction from said first surface and supporting a printed circuit board;
   wherein said first surface has length L and width W, wherein L>2W, and W<the length of arc subtended along the inner surface of a tire corresponding to 5° of rotation measured from a line extending from the center of rotation to the inner surface of an unloaded tire inflated at rated pressure, and
   wherein said pair of terminal/support elements are arranged in a line 90°±10° to a line in the direction of the length L, and the line 90°±10° to the direction of length L identifies the direction of rotation of a supporting tire.

2. The tire mountable apparatus of claim 1, wherein said pair of terminal/support elements extends from said first surface in a line 90°±5° to a line in the direction of the length L, and the line 90°±5° to the direction of length L identifies the direction of rotation of a supporting tire.

3. The tire mountable apparatus of claim 1, further comprising:
   an elastomeric patch having a first surface and a second surface separated by a mesa,
   wherein said second surface of said substrate is adhered to said first surface of said elastomeric patch.

4. The tire mountable apparatus of claim 3, wherein said mesa has a height H, wherein 0<H≦5 mm, and wherein L>W>H.

5. The tire mountable apparatus of claim 3, further comprising:
   a layer of piezoelectric material having a top surface and a bottom surface;
   a first conductive layer covering said top surface; and
   a second conductive layer covering said bottom surface;
   wherein said piezoelectric layer, said first and second conductive layers, and said substrate form a sandwich structure, and wherein said sandwich structure is secured to the first surface of said elastomeric substrate.

6. The tire mountable apparatus of claim 3, wherein the substrate is FR4.

7. The tire mountable apparatus of claim 5, wherein the piezoelectric material is lead zirconium titanate (PZT).

8. The tire mountable apparatus of claim 5, wherein a first terminal/support element of the pair of terminal/support elements is electrically coupled to the first conductive layer and a second terminal/support element of the pair of terminal/support elements is electrically coupled to the second conductive layer.

9. The tire mountable apparatus of claim 5, wherein said sandwich structure is secured to said upper surface of said elastomeric substrate with an adhesive.

10. The tire mountable apparatus of claim 1, wherein said pair of terminal/support elements are spaced apart a distance less than about 18 mm.

11. The tire mountable apparatus of claim 1, wherein the width W is less than about 30 mm.

12. A method for reducing strain in a tire mounted assembly, comprising:
   providing a substrate having a first surface and a second surface, wherein said substrate has length L and width W, wherein L>2W, and W<the length of arc subtended along the inner surface of a tire corresponding to 5° of rotation measured from a line extending from the center of rotation to the inner surface of an unloaded tire inflated at rated pressure;
   providing a pair of terminal/support elements extending in the same direction from said first surface;
   positioning said pair of terminal/support elements in a line 90°±10° to a line in the direction of the length L; and
   providing a printed circuit board;
   securing said printed circuit board to said pair of terminal/support elements such that said printed circuit board is supported above said first surface by said pair of terminal/support elements; and
   mounting the substrate in a tire so that the line 90°±10° to the direction of the length L is aligned in the direction of rotation of said tire ±20°,
   whereby strain on the tire mounted assembly is effectively limited to one direction.

13. The method of claim 12, comprising:
positioning said pair of terminal/support elements in a line 90°±5° to a line in the direction of the length L; and
mounting the substrate in a tire so that the line 90°±5° to the direction of the length L is aligned substantially in the direction of rotation of said tire ±10°.

14. The method of claim 12, wherein mounting the substrate comprises securing the substrate laterally in the central portion of the tire summit.

15. The method of claim 12, further comprising positioning the pair of terminal/support elements less than about 18 mm apart.

16. The method of claim 12, further comprising providing the substrate with a width W of less than about 30 mm.

17. The method of claim 12, further comprising:
providing a piezoelectric device having a piezoelectric layer sandwiched between first and second conductive layers with one of said first and second conductive layers supported by said substrate layer,
whereby strain on the piezoelectric device is effectively limited to one direction.

18. The method of claim 12, further comprising:
providing an elastomeric patch having a first surface and a second surface separated by a mesa having a height H;
securing said second surface of said substrate to said first surface of said elastomeric patch; and
securing said second surface of said elastomeric patch to an inner surface of a tire.

\* \* \* \* \*